United States Patent
Zhang et al.

(10) Patent No.: US 10,261,372 B2
(45) Date of Patent: Apr. 16, 2019

(54) ARRAY SUBSTRATE AND MANUFACTURE METHOD THEREOF, LIQUID CRYSTAL PANEL AND LIQUID CRYSTAL DISPLAY SCREEN

(71) Applicant: Wuhan China Star Optoelectronics Technology Co., Ltd., Wuhan, Hubei (CN)

(72) Inventors: Chunqian Zhang, Guangdong (CN); Caiqin Chen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 109 days.

(21) Appl. No.: 15/328,130

(22) PCT Filed: Nov. 23, 2016

(86) PCT No.: PCT/CN2016/106898
§ 371 (c)(1),
(2) Date: Jan. 23, 2017

(87) PCT Pub. No.: WO2018/076429
PCT Pub. Date: May 3, 2018

(65) Prior Publication Data
US 2018/0210300 A1   Jul. 26, 2018

(30) Foreign Application Priority Data
Oct. 26, 2016 (CN) .......................... 2016 1 0948550

(51) Int. Cl.
*G02F 1/1333* (2006.01)
*G02F 1/1343* (2006.01)
(Continued)

(52) U.S. Cl.
CPC ...... *G02F 1/136227* (2013.01); *G02F 1/1333* (2013.01); *G02F 1/1343* (2013.01);
(Continued)

(58) Field of Classification Search
CPC ............. G02F 1/136227; G02F 1/1333; G02F 1/133345
See application file for complete search history.

(56) References Cited

U.S. PATENT DOCUMENTS

| 2001/0008457 A1* | 7/2001 | Zhang | B81C 1/00182 |
| | | | 359/238 |
| 2003/0116758 A1* | 6/2003 | Morii | B82Y 30/00 |
| | | | 252/582 |

(Continued)

FOREIGN PATENT DOCUMENTS

| CN | 102141710 A | 8/2011 |
| CN | 102541333 A | 7/2012 |

(Continued)

*Primary Examiner* — Lucy P Chien
(74) *Attorney, Agent, or Firm* — Andrew C. Cheng

(57) ABSTRACT

The present application provides a manufacture method of an array substrate, wherein the manufacture method comprises providing a substrate; sequentially forming a planarization layer, a first common electrode layer and a first insulation layer on the substrate; forming a metal line layer on the first insulation layer; depositing a second insulation layer on a second metal layer and the first insulation layer; forming a plurality of through holes in the second insulation layer; forming a second common electrode layer on the second insulation layer which is formed with the through holes. The present application further provides a liquid crystal panel and a liquid crystal display screen.

8 Claims, 3 Drawing Sheets

(51) Int. Cl.
   *G02F 1/1362* (2006.01)
   *H01L 27/12* (2006.01)
   *H01L 21/768* (2006.01)
   *H01L 21/027* (2006.01)
   *H01L 21/311* (2006.01)

(52) U.S. Cl.
   CPC .. *G02F 1/133345* (2013.01); *G02F 1/136286* (2013.01); *H01L 21/0273* (2013.01); *H01L 21/31111* (2013.01); *H01L 21/31144* (2013.01); *H01L 21/76802* (2013.01); *H01L 27/124* (2013.01); *H01L 27/1218* (2013.01); *H01L 27/1248* (2013.01); *H01L 27/1262* (2013.01); *H01L 27/1288* (2013.01); *G02F 2001/133357* (2013.01); *G02F 2001/136295* (2013.01)

(56) References Cited

U.S. PATENT DOCUMENTS

| | | | |
|---|---|---|---|
| 2006/0051974 A1* | 3/2006 | French | G03F 1/32 438/764 |
| 2009/0160748 A1 | 6/2009 | Kimura | |

FOREIGN PATENT DOCUMENTS

| | | | |
|---|---|---|---|
| CN | 103454817 A | 12/2013 | |
| CN | 105097829 A | 11/2015 | |
| CN | 105867689 A | 8/2016 | |

* cited by examiner

ARRAY SUBSTRATE AND MANUFACTURE METHOD THEREOF, LIQUID CRYSTAL PANEL AND LIQUID CRYSTAL DISPLAY SCREEN

CROSS REFERENCE

This application claims the priority of Chinese Patent Application No. 201610948550.5, entitled "Array substrate and manufacture method thereof, liquid crystal panel and liquid crystal display screen", filed on Oct. 26, 2016, the disclosure of which is incorporated herein by reference in its entirety.

FIELD OF THE INVENTION

The present invention relates to a manufacture field of the liquid crystal panel, and more particularly to a manufacture method of an array substrate, an array substrate, a liquid crystal panel and a liquid crystal display screen.

BACKGROUND OF THE INVENTION

The liquid crystal display is the common skill in the modern display. With the development requirement of becoming thinner, lighter and having cost control for the cell phone and tablet, the realization of the integration of the touch panel part which is previously located outside and the liquid crystal panel becomes more important. However, the embedded touch control introduces the electrodes and adds insulation layers, which lead to the decrease of the construction space to result in kinds of display issues due to the electric leakage.

SUMMARY OF THE INVENTION

The present invention provides a manufacture method of an array substrate and an array substrate, in which a thickness of an insulation layer between two common electrode layers to increase the capacitance volume and to reduce kinds of display issues due to the electric leakage.

The present invention further provides a liquid crystal panel and a liquid crystal display screen.

The manufacture method of the array substrate comprises providing a substrate;

sequentially forming a planarization layer, a first common electrode layer and a first insulation layer on the substrate;

forming a metal line layer on the first insulation layer;

depositing a second insulation layer on a second metal layer and the first insulation layer;

forming a plurality of through holes in the second insulation layer;

forming a second common electrode layer on the second insulation layer which is formed with the through holes.

The step of forming the through holes in the second insulation layer comprises forming a photoresist layer, forming a second common electrode layer pattern to the photoresist layer with a patterning process, wherein the second common electrode layer pattern comprises a plurality of hollow areas;

etching the second insulation layer according to the second common electrode layer pattern to form the through holes in the second insulation layer corresponding to the hollow areas.

The step of forming the second common electrode layer on the second insulation layer which is formed with the through holes comprises depositing the electrode layer on the photoresist layer, removing the electrode layer outside the through holes to form the second common electrode layer.

The step of removing the electrode layer outside the through holes to form the second common electrode layer comprises etching the electrode layer outside the through holes; removing the photoresist layer.

The step of removing the electrode layer outside the through holes to form the second common electrode layer comprises removing the photoresist layer with acetone reagent.

The step of removing the electrode layer outside the through holes to form the second common electrode layer comprises removing the photoresist layer and the electrode layer on the photoresist layer with a half tone mask.

The substrate comprises a glass substrate, a gate electrode, a gate insulation layer, a thin film transistor switch, an insulation layer and a first metal line which are sequentially formed on a surface of the glass substrate, and the planarization layer covers the first metal line layer and the substrate exposing the first metal line.

The array substrate of the present application comprises a substrate, a planarization layer, a first common electrode layer, a first insulation layer, a metal line layer which are sequentially formed on the substrate, and a second insulation layer covering a second metal layer and the first insulation layer; the second insulation layer formed with a plurality of through holes; the plurality of through holes filled with an electrode material to form a second common electrode layer.

The liquid crystal panel of the present application comprises the array substrate, a color film substrate and a liquid crystal layer sandwiched between the array substrate and the color film substrate.

The liquid crystal display screen of the present application comprises the liquid crystal panel.

The second common electrode layer in the array substrate of the present invention is located inside the through holes of the second insulation layer to increase the storage capacitance and the parasitic capacitance for reducing kinds of display issues due to the electric leakage.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 3:
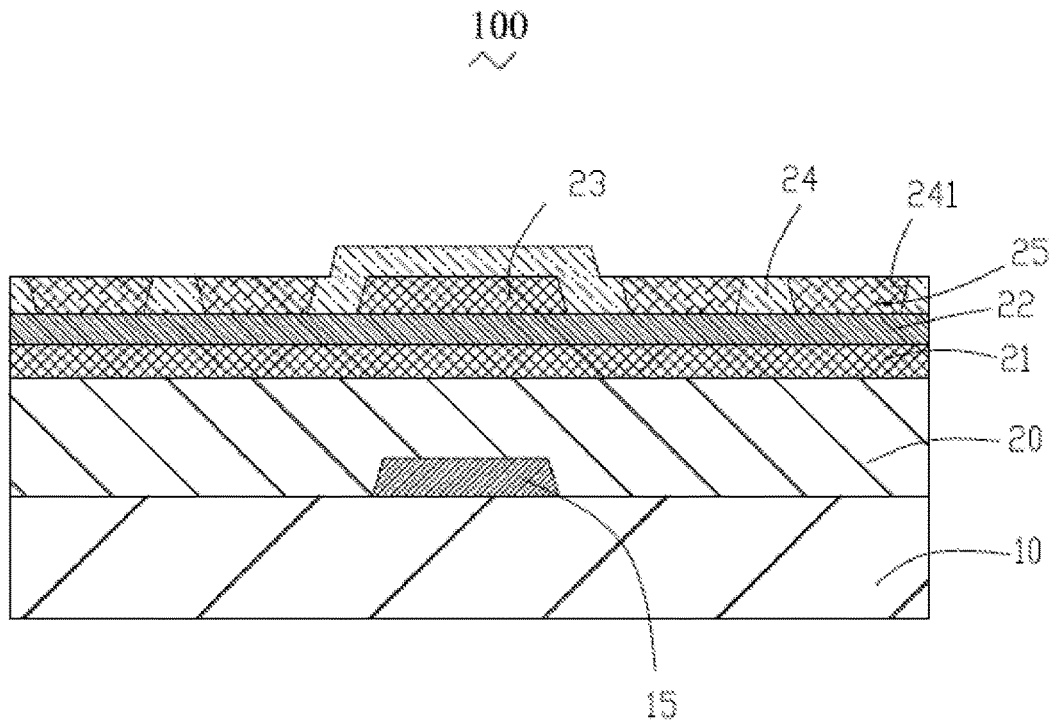
FIG. 3 is a diagram of an array of the present invention.

Please refer to FIG. 3. The present invention provides an array substrate 100 and a liquid crystal panel 200. The array substrate comprises a substrate 10, a planarization layer 20, a first common electrode layer 21, a first insulation layer 22, a metal line layer 23 which are sequentially formed on the substrate 10, and a second insulation layer 24 covering a second metal layer 23 and the first insulation layer 22; the second insulation layer 24 formed with a plurality of through holes 241; the plurality of through holes 241 filled with an electrode material to form a second common electrode layer 25.

Figure 4:
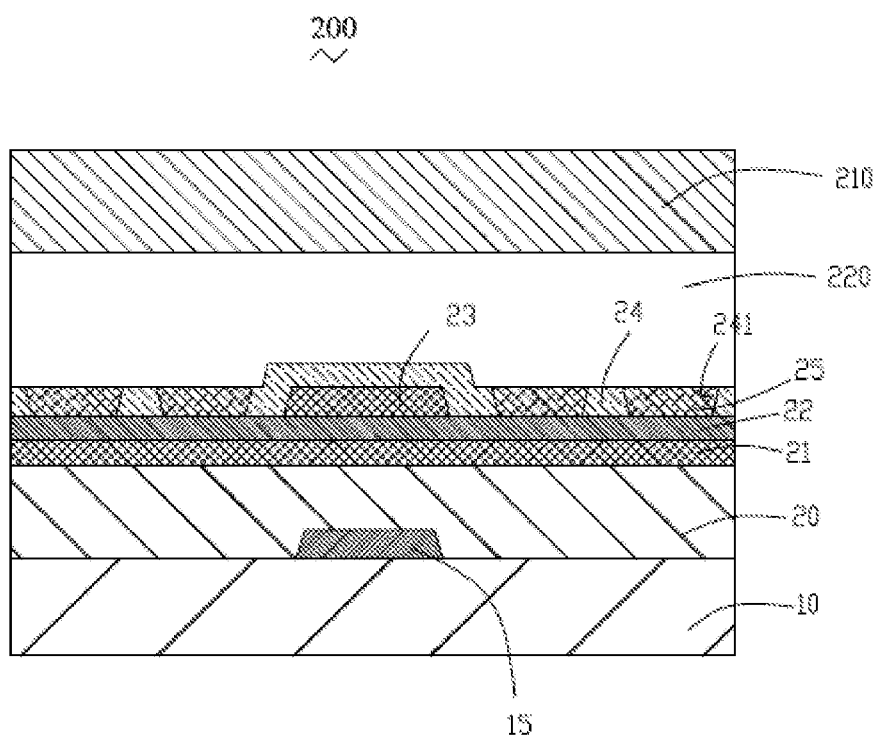
FIG. 4 is a diagram of a liquid crystal panel of the present invention.

Please refer to FIG. 4. The liquid crystal panel 200 is employed in a liquid crystal display screen. The liquid crystal panel 200 comprises the array substrate 100, a color film substrate 210 and a liquid crystal layer 220 sandwiched between the array substrate 100 and the color film substrate 210.

The second common electrode layer 25 in the array substrate of the present invention is deposited inside the through holes of the second insulation layer 24 to decrease the entire thickness of the first insulation layer 22 and the second insulation layer 24 to increase the storage capacitance and the parasitic capacitance for reducing kinds of display issues due to the electric leakage.

Figure 1:
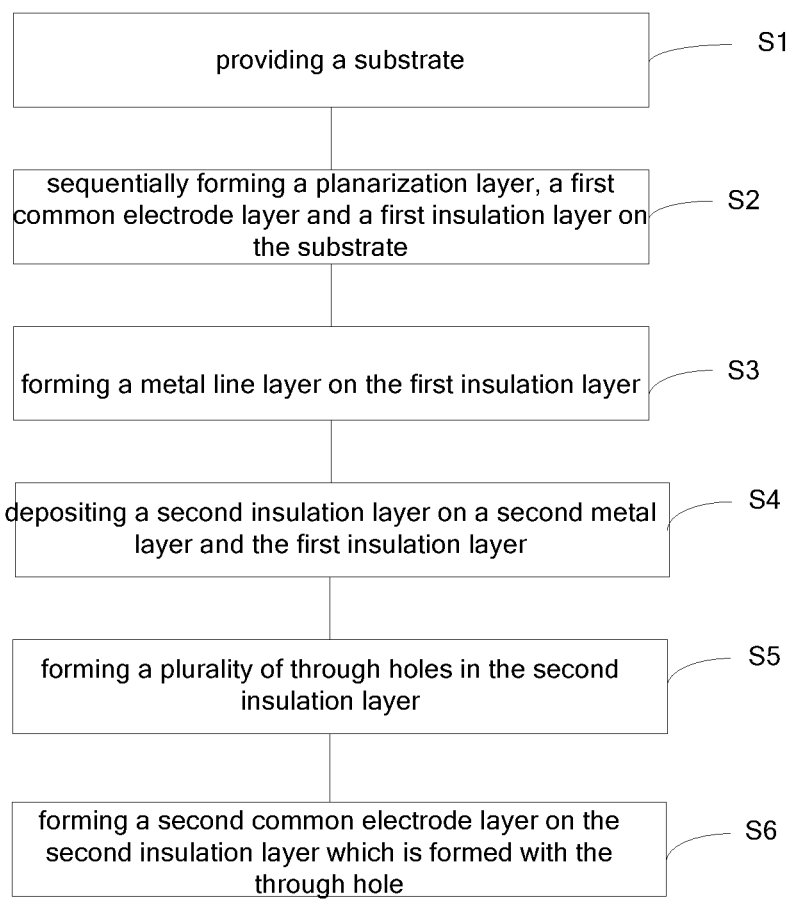
FIG. 1 is a flowchart of a manufacture method of an array substrate according to the present invention.

Please refer to FIG. 1. The present invention further provides a manufacture method of an array substrate, and the manufacture method comprises:

step S1, providing a substrate 10;

step S2, sequentially forming a planarization layer 20, a first common electrode layer 21 and a first insulation layer 22 on the substrate;

step S3, forming a metal line layer 23 on the first insulation layer 22;

step S4, depositing a second insulation layer 24 on a second metal layer 23 and the first insulation layer 22;

step S5, forming a plurality of through holes 241 in the second insulation layer 24;

step S6, forming a second common electrode layer 25 on the second insulation layer 24 which is formed with the through holes 241.

Figure 2:
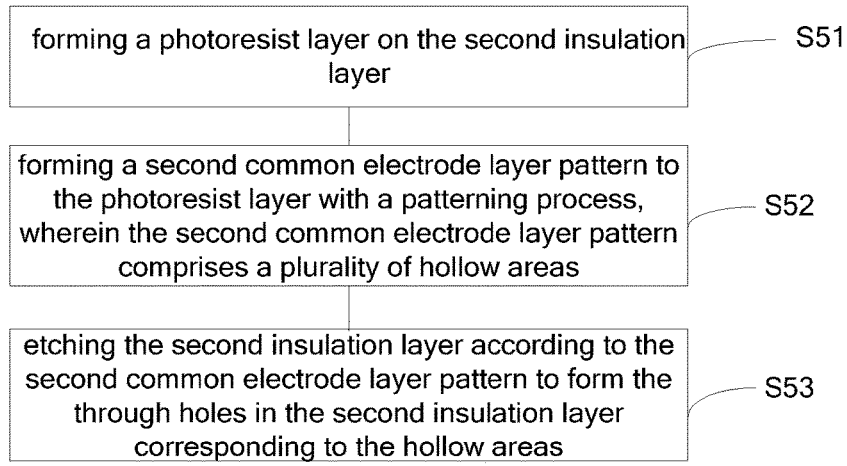
FIG. 2 is a specific step flowchart of step 5 in the manufacture method of the array substrate shown in FIG. 1.

Please refer to FIG. 2. Furthermore, step S5 of forming the through holes in the second insulation layer 24 comprises step S51 of forming a photoresist layer on the second insulation layer.

step S52, forming a second common electrode layer pattern to the photoresist layer with a patterning process, wherein the second common electrode layer pattern comprises a plurality of hollow areas.

step S53 of etching the second insulation layer 24 according to the second common electrode layer pattern to form the through holes 241 in the second insulation layer 24 corresponding to the hollow areas.

In this embodiment, step S6 of forming the second common electrode layer 25 on the second insulation layer 24 which is formed with the through holes 241 comprises a step of depositing the electrode layer on the photoresist layer;

and a step of removing the electrode layer outside the through holes 241 to form the second common electrode layer 25.

In one embodiment of the present invention, the aforesaid step of removing the electrode layer outside the through holes 241 to form the second common electrode layer comprises etching the electrode layer outside the through holes 241; this step is mainly to remove the redundant electrode layer and to preserve electrode material in the through holes to form the second common electrode layer 25, and then, removing the photoresist layer to expose the second common electrode layer 25.

In another embodiment of the present invention, the step of removing the electrode layer outside the through holes 241 to form the second common electrode layer comprises removing the photoresist layer with acetone reagent. Because the electrode layer is formed on the photoresist layer and formed in the through holes with the photoresist layer. Then, removing the photoresist layer can directly removing the electrode layer outside the through holes 241, and thus to form the second common electrode layer 25.

In the third embodiment of the present invention, the step of removing the electrode layer outside the through holes to form the second common electrode layer is to remove the photoresist layer and the electrode layer on the photoresist layer with a half tone mask.

In this embodiment, the substrate 10 mainly comprises a glass substrate, a gate electrode, a gate insulation layer, a thin film transistor switch, an insulation layer and a first metal line 15 which are sequentially formed on a surface of the glass substrate, and the planarization layer covers the first metal line layer and the substrate exposing the first metal line. The specific position of the thin film transistor is determined according to the design requirement of the array substrate, and the first metal line is a data line.

The array substrate of the present invention decreases the thickness of the insulation layer between the first common electrode layer 21 and the second common electrode layer 25 to increase the storage capacitance and the parasitic capacitance for reducing kinds of display issues due to the electric leakage.

Above are embodiments of the present invention, which does not limit the scope of the present invention. Any modifications, equivalent replacements or improvements within the spirit and principles of the embodiment described above should be covered by the protected scope of the invention.

What is claimed is:

1. A manufacture method of an array substrate, wherein the manufacture method comprises providing a substrate;
   sequentially forming a planarization layer, a first common electrode layer and a first insulation layer on the substrate;
   forming a metal line layer on the first insulation layer;
   depositing a second insulation layer on a second metal layer and the first insulation layer;
   forming a photoresist layer;
   forming a second common electrode layer pattern to the photoresist layer with a patterning process, wherein the second common electrode layer pattern comprises a plurality of hollow areas;
   etching the second insulation layer according to the second common electrode layer pattern to form the through holes in the second insulation layer corresponding to the hollow areas;
   depositing the electrode layer on the photoresist layer; and
   removing the electrode layer outside the through holes to form the second common electrode layer only located inside the through holes of the second insulation layer.

2. The manufacture method of the array substrate according to claim 1, wherein the step of removing the electrode layer outside the through holes to form the second common electrode layer comprises etching the electrode layer outside the through holes; removing the photoresist layer.

3. The manufacture method of the array substrate according to claim 1, wherein the step of removing the electrode layer outside the through holes to form the second common electrode layer comprises removing the photoresist layer with acetone reagent.

4. The manufacture method of the array substrate according to claim 1, wherein the step of removing the electrode layer outside the through holes to form the second common electrode layer comprises removing the photoresist layer and the electrode layer on the photoresist layer with a half tone mask.

5. The manufacture method of the array substrate according to claim 1, wherein the substrate comprises a glass substrate, a gate electrode, a gate insulation layer, a thin film transistor switch, an insulation layer and a first metal line which are sequentially formed on a surface of the glass substrate, and the planarization layer covers the first metal line layer and the substrate exposing the first metal line.

6. An array substrate, comprising a substrate, a planarization layer, a first common electrode layer, a first insulation layer, a metal line layer which are sequentially formed on the substrate, and a second insulation layer covering a second metal layer and the first insulation layer; the second insulation layer formed with a plurality of through holes; the plurality of through holes filled with an electrode material to form a second common electrode layer only located inside the through holes of the second insulation layer.

7. A liquid crystal panel, comprising the array substrate according to claim 6, a color film substrate and a liquid crystal layer sandwiched between the array substrate and the color film substrate.

8. A liquid crystal display screen, comprising the liquid crystal panel according to claim 7.

* * * * *